United States Patent
Luo

(10) Patent No.: US 11,942,932 B2
(45) Date of Patent: Mar. 26, 2024

(54) LEVEL CONVERSION CIRCUIT AND ELECTRONIC DEVICE

(71) Applicant: Shanghai Yaohuo Microelectronics Co., Ltd., Shanghai (CN)

(72) Inventor: Yongjin Luo, Shanghai (CN)

(*) Notice: Subject to any disclaimer, the term of this patent is extended or adjusted under 35 U.S.C. 154(b) by 224 days.

(21) Appl. No.: 17/709,424

(22) Filed: Mar. 31, 2022

(65) Prior Publication Data
US 2023/0006671 A1 Jan. 5, 2023

(30) Foreign Application Priority Data
Jul. 1, 2021 (CN) .......................... 202110747698.3

(51) Int. Cl.
*H03K 19/0185* (2006.01)
*G05F 1/575* (2006.01)
*H03K 17/687* (2006.01)

(52) U.S. Cl.
CPC ..... *H03K 19/018507* (2013.01); *G05F 1/575* (2013.01); *H03K 17/687* (2013.01)

(58) Field of Classification Search
CPC ......... H03K 19/018507; H03K 17/687; H03K 2217/0054; H03K 17/08122; H03K 19/017509; G05F 1/575
See application file for complete search history.

(56) References Cited

U.S. PATENT DOCUMENTS

2013/0002299 A1* 1/2013 Hung ............. H03K 19/017509
326/63

FOREIGN PATENT DOCUMENTS

CN 106849937 A 6/2017

* cited by examiner

*Primary Examiner* — Daniel D Chang

(57) ABSTRACT

A level conversion circuit includes a first pin, a second pin, a target pin, a core module and a switch. A first terminal of the switch is connected to the first pin, a second terminal of the switch is connected to the second pin, and the core module is connected to the target pin, the second pin and a control terminal of the switch respectively. The core module is configured to: when a voltage connected to the target pin is at a first reference high level, control the switch to turn on to transmit a signal with a specified voltage amplitude, and pull the first pin to the first reference high level and the second pin to a second reference high level based on the first reference high level; where the first reference high level is higher than the second reference high level.

13 Claims, 3 Drawing Sheets

LEVEL CONVERSION CIRCUIT AND ELECTRONIC DEVICE

CROSS REFERENCE TO THE RELATED APPLICATIONS

This application is based upon and claims priority to Chinese Patent Application No. 202110747698.3 filed on Jul. 1, 2021, the entire contents of which are incorporated herein by reference.

TECHNICAL FIELD

The present invention relates to the field of circuits, and in particular, to a level conversion circuit and an electronic device.

BACKGROUND

During digital signal communication between a receiver and a transmitter, a mismatch of logic high levels between the receiver and the transmitter often occurs, so that it is necessary to use a logic level conversion circuit (i.e., a level conversion circuit). However, a large number of devices that use level conversion circuits are often mobile phones or wearable devices that require the smallest possible circuit board area.

In the prior art, a level conversion circuit is to be connected with a plurality of pins, including an enabling pin, a ground pin, two input/output pins (i.e., IO pins) and two reference high level pins, so that when the input/output pins need to be pulled to a high level, the two input/output pins can be pulled to a corresponding high level by voltages of the two reference high level pins.

It is thus learned that in the solution, six pins are required, which in turn leads to problems such as large chip area and high costs.

SUMMARY

The present invention provides a level conversion circuit and an electronic device to solve the problems of large chip area and high costs.

According to a first aspect, the present invention provides a level conversion circuit, including a first pin, a second pin, a target pin, a core module and a switch;

a first terminal of the switch is connected to the first pin, a second terminal of the switch is connected to the second pin, and the core module is connected to the target pin, the second pin and a control terminal of the switch respectively;

the core module is configured to:

when a voltage connected to the target pin is at a first reference high level, control the switch to turn on to transmit a signal with a specified voltage amplitude, and pull the first pin to the first reference high level and the second pin to a second reference high level based on the first reference high level; and control the switch to turn off when the voltage connected to the target pin is at a ground level.

The first reference high level is higher than the second reference high level; and at the specified voltage amplitude, a voltage of the signal transmitted through the switch is not higher than the first reference high level and the second reference high level.

Optionally, the core module is further configured to:

control the first pin and the second pin at the ground level when the voltage connected to the target pin is at the ground level.

Optionally, the core module includes a first voltage regulating unit and an enabling control unit;

a first side of the first voltage regulating unit is connected to the target pin, a second side of the first voltage regulating unit is connected to a first side of the enabling control unit, a second side of the enabling control unit is connected to the control terminal of the switch, and the target pin is also connected to the first pin and the second pin directly or indirectly;

when the voltage connected to the target pin is at the first reference high level, a voltage at the first side of the first voltage regulating unit is at the first reference high level, and a voltage at the second side of the first voltage regulating unit is not lower than the second reference high level and not higher than the sum of the second reference high level and a threshold voltage of the switch;

the enabling control unit is configured to: when the voltage connected to the target pin is at the first reference high level, control the switch to turn on in response to the voltage at the second side of the first voltage regulating unit to transmit the signal with the specified voltage amplitude; and control the switch to turn off when the voltage connected to the target pin is at the ground level.

Optionally, the first voltage regulating unit is a low dropout regulator (LDO).

Optionally, the core module further includes a second voltage regulating unit, a first side of the second voltage regulating unit is connected to the target pin, and a second side of the second voltage regulating unit is connected to the second pin directly or indirectly;

when the voltage connected to the target pin is at the first reference high level, a voltage at the first side of the second voltage regulating unit is at the first reference high level, and a voltage at the second side of the second voltage regulating unit is at the second reference high level.

Optionally, the core module further includes a first short-circuit pull-up unit disposed between the target pin and the first pin, and a second short-circuit pull-up unit disposed between the second side of the second voltage regulating unit and the second pin.

Optionally, the second voltage regulating unit is a low dropout regulator (LDO).

Optionally, the level conversion circuit is arranged on the same chip.

Optionally, the chip is further provided with a ground pin.

According to a second aspect, the present invention provides an electronic device, including the level conversion circuit according to the first aspect and optional solutions thereof.

According to the level conversion circuit and the electronic device provided in the present invention, because the core module can pull the first pin to the first reference high level and the second pin to the second reference high level based on the first reference high level when the voltage connected to the target pin is at the first reference high level, the first reference high level and the second reference high level are high levels of different voltages. Therefore, based on access of the target pin to the first reference high level and cooperation of the core module, the target pin can implement both functions of an enabling pin and reference high level pins in the prior art, that is, the switch is enabled and two reference high levels are provided. It is thus learned that the number of pins used by the level conversion circuit is reduced by two and a circuit structure is simplified in the present invention, thereby reducing area and costs of the circuit and the chip, and saving internal space of the electronic device.

BRIEF DESCRIPTION OF THE DRAWINGS

In order to explain the technical solutions in the embodiments of the present invention or in the prior art more clearly, the drawings used in the description of the embodiments or the prior art will be briefly introduced below. Obviously, the drawings in the following description are merely some embodiments of the present invention. For those of ordinary skill in the art, other drawings can be obtained based on these drawings without creative efforts.

DESCRIPTION OF REFERENCE SIGNS IN THE DRAWINGS

Figure 1:
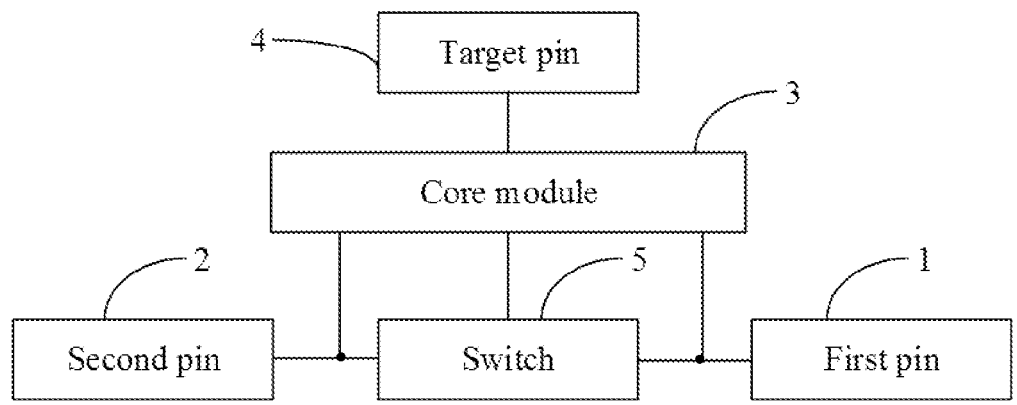
FIG. 1 is a schematic diagram I of a circuit structure of a level conversion circuit according to an embodiment of the present invention.

1—first pin;
2—second pin;
3—core module;
31—first voltage regulating unit;
32—enabling control unit;
33—second voltage regulating unit;
34—first short-circuit pull-up unit;
35—second short-circuit pull-up unit; and
4—target pin.

DETAILED DESCRIPTION OF EMBODIMENTS

The following clearly and completely describes the technical solutions in the embodiments of the present invention with reference to the accompanying drawings in the embodiments of the present invention. Obviously, the described embodiments are merely some but not all of embodiments of the present invention. Based on the embodiments of the present invention, all other embodiments obtained by those of ordinary skill in the art without creative efforts should fall within the protection scope of the present invention.

In the specification, claims and accompanying drawings of the present invention, the terms "first", "second", "third", "fourth" and so on (if any) are intended to distinguish between similar objects but do not necessarily indicate a specific order or sequence. It should be understood that the terms so used may be interchanged where appropriate, so that the embodiments described herein can be implemented in a sequence other than what is illustrated or described herein. Furthermore, the terms "comprise" and "include" and any variations thereof are intended to cover a non-exclusive inclusion, such that a process, method, system, product or apparatus that comprises a list of steps or units does not include only those steps or units, but may include other steps or units not explicitly listed or inherent to such process, method, product or apparatus.

The technical solutions of the present invention will be described in detail with reference to specific embodiments below. The following specific embodiments may be combined with each other, and details of the same or similar concepts or processes may not be repeated in some embodiments.

Referring to FIG. 1 to FIG. 5, an embodiment of the present invention provides a level conversion circuit, and the level conversion circuit can be arranged on the same chip that may have a ground pin.

In the embodiment of the present invention, the level conversion circuit includes a first pin 1, a second pin 2, a target pin 4, a core module 3 and a switch 5.

A first terminal of the switch 5 is connected to the first pin 1, a second terminal of the switch 5 is connected to the second pin 2, and the core module 3 is connected to the target pin 4, the second pin 2 and a control terminal of the switch 5 respectively.

The switch 5 may be any device that can be controlled to turn on or off, such as a transistor, specifically a triode or a field-effect transistor. Therefore, the control terminal of the switch 5 may be, for example, a base or a gate. In the solution shown in FIG. 5, the switch 5 is an NMOS transistor.

In a further example, the switch 5 may have a threshold voltage Vth, which can be specifically understood as a gate-to-source threshold voltage that enables the switch to turn on.

The first pin 1 and the second pin 2 can be any pins for digital signal transmission. In the level conversion circuit, a high level voltage transmitted by the second pin is lower than a high level transmitted by the first pin. In an example shown in FIG. 5, the first pin 1 is a high voltage side pin (i.e., an IOVH pin) and the second pin 2 is a low voltage side pin (i.e., an IOVL pin).

The target pin 4 can be any pin capable of transmitting an electrical signal. In the example shown in FIG. 5, the target pin 4 can be characterized as a VCCEN pin because the target pin enables and provides a reference high level.

In the embodiment of the present invention, the core module 3 is configured to:

when a voltage connected to the target pin 4 is at a first reference high level, control the switch 5 to turn on to transmit a signal with a specified voltage amplitude, and pull the first pin to the first reference high level and the second pin to a second reference high level based on the first reference high level;

the first reference high level is higher than the second reference high level; and at the specified voltage amplitude, a voltage of the signal transmitted through the switch is not higher than the first reference high level and the second reference high level.

The core module 3 provides two voltages (i.e., the first reference high level and the second reference high level) respectively based on the same voltage (i.e., the first reference high level), and thus, no matter how the pin is pulled to a reference high level, the voltages are not out of the scope of the embodiment of the present invention. Because the first reference high level is higher than the second reference high level, step-down voltage regulation will be implemented in the core module 3.

In the above solution, based on access of the target pin to the first reference high level and cooperation of the core module, the target pin can implement both functions of an enabling pin and reference high level pins in the prior art, that is, the switch is enabled and two reference high levels are provided. It is thus clear that the number of pins used by the level conversion circuit is reduced by two and a circuit structure is simplified in the embodiment of the present invention, thereby reducing area and costs of the circuit and the chip, and saving internal space of the electronic device.

Furthermore, the core module 3 may be further configured to:
control the first pin and the second pin at the ground level when a voltage of the target pin is at the ground level.

The ground level can also be understood as a ground voltage, specifically a ground potential of a chip of a logic conversion circuit (e.g., 0 V), but is not limited thereto.

In one of the implementations, to achieve step-down regulation, the core module 3 may include a first voltage regulating unit 31 and an enabling control unit 32.

A first side of the first voltage regulating unit 31 is connected to the target pin 4, a second side of the first voltage regulating unit 31 is connected to a first side of the enabling control unit 32, a second side of the enabling control unit 32 is connected to the control terminal of the switch 5, and the target pin 4 is also connected to the first pin 1 and the second pin 2 directly or indirectly. In an example shown in FIG. 2, the target pin 4 is connected to the first pin 1 and the second pin 2 directly, and in examples shown in FIG. 3 to FIG. 5, the target pin 4 is connected to a corresponding pin (i.e., the first pin 1 and/or the second pin 2) indirectly (for example, through a corresponding voltage regulating unit and/or short-circuit pull-up unit).

When the voltage connected to the target pin is at the first reference high level, a voltage at the first side of the first voltage regulating unit is at the first reference high level, and a voltage at the second side of the first voltage regulating unit is not lower than the second reference high level and not higher than the sum of the second reference high level and a threshold voltage of the switch.

The enabling control unit 32 is configured to:
when the voltage connected to the target pin is at the first reference high level, control the switch 5 to turn on in response to the voltage at the second side of the first voltage regulating unit to transmit the signal with the specified voltage amplitude; and
control the switch to turn off when the voltage connected to the target pin is at the ground level.

For example, when the voltage connected to the target pin is at the first reference high level, then:
if the voltage at the second side of the first voltage regulating unit is at the second reference high level, the first pin is pulled to the second reference high level and the switch is on (i.e., turned on), and pins (i.e., the first pin and the second pin) at both sides of the switch are pulled to the corresponding first reference high level and second reference high level respectively;
if the voltage at the second side of the first voltage regulating unit is the sum of the second reference high level and the threshold voltage, the first pin is pulled to the second reference high level, and the switch is on, so that all transmitted signals lower than the second reference high level can pass through directly through the switch.

The enabling control unit 32 can be understood as a circuit unit capable of controlling on-off of the switch based on received external signals. In a further solution, the enabling control unit 32 may also have a function of automatically turning off the switch in case of overtemperature.

The first voltage regulating unit may be capable of regulating voltages, which can be achieved by linear voltage regulation, or achieved by switching a power supply or combining with a voltage divider resistor. In a specific solution, the first voltage regulating unit 31 may be a low dropout regulator (LDO). A voltage at the first side, a voltage at the second side, and the dropout between the voltage at the first side and the voltage at the second side can be preset as required. Furthermore, the voltage at the second side of the first voltage regulating unit 31 can be preset to match circuits shown in FIG. 2 to FIG. 5.

Figure 2:
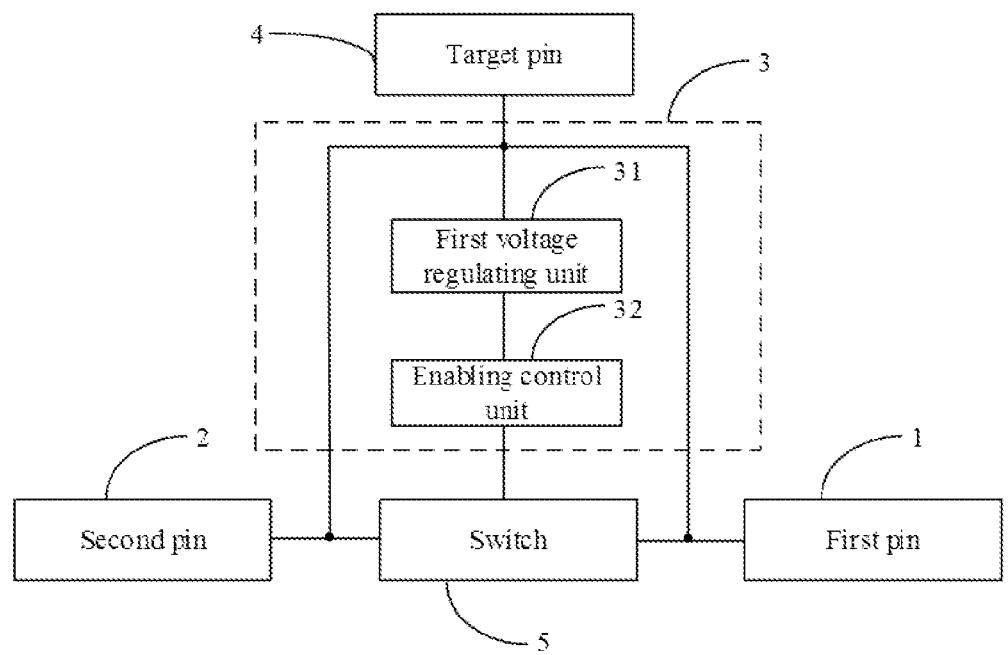
FIG. 2 is a schematic diagram II of a circuit structure of a level conversion circuit according to an embodiment of the present invention.

Specifically, in the circuit shown in FIG. 2 (i.e., the second voltage regulating unit 33, the first short-circuit pull-up unit 34 and the second short-circuit pull-up unit 35 mentioned below are not used):
for example, when the first voltage regulating unit is an LDO, the first reference high level at the first side of the first voltage regulating unit 31 can be described as VH_Ref, the voltage at the second side of the first voltage regulating unit 31 can be described as VLDO1, the second reference high level can be described as VL_Ref, and the threshold voltage can be described as Vth, then:
in an example shown in FIG. 2, VLDO=VL_Ref+Vth; and
in another example shown in FIG. 2, VLDO is slightly less than VL_Ref+Vth, for example: VLDO= 0.9*VL_Ref+Vth. It can also be understood that the value of VL_Ref+Vth−VLDO is less than a preset difference threshold.

Figure 3:
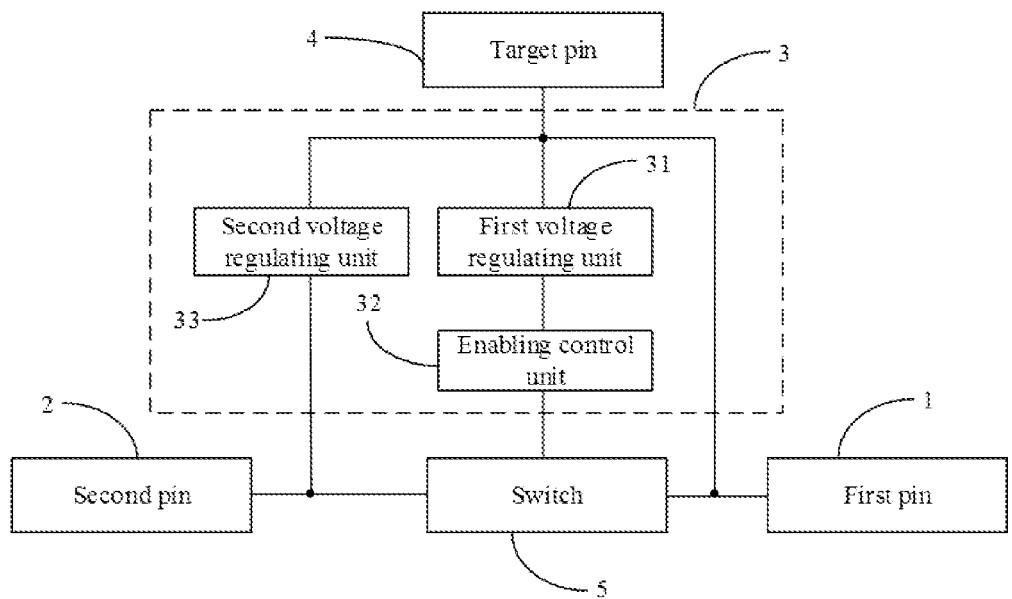
FIG. 3 is a schematic diagram III of a circuit structure of a level conversion circuit according to an embodiment of the present invention.
Figure 4:
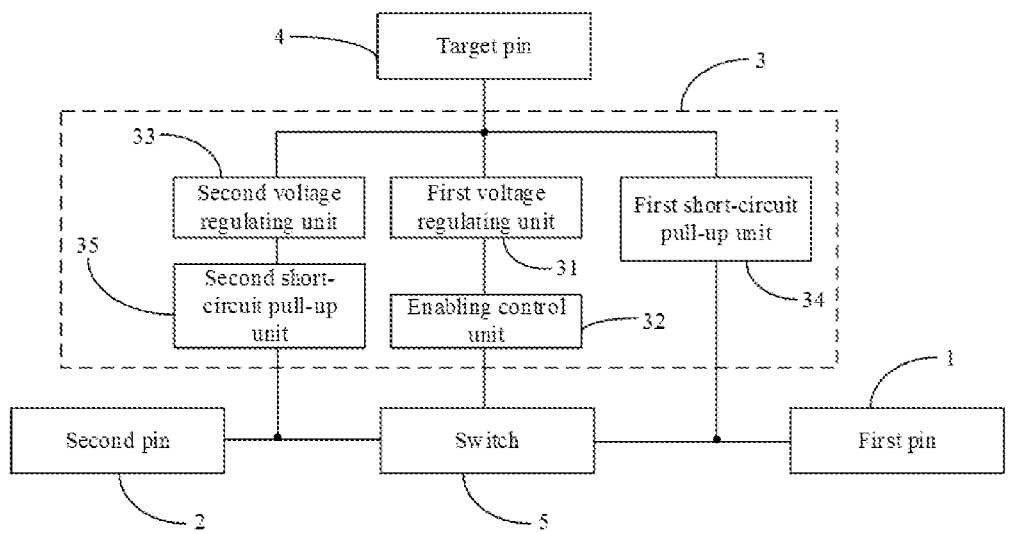
FIG. 4 is a schematic diagram IV of a circuit structure of a level conversion circuit according to an embodiment of the present invention.
Figure 5:
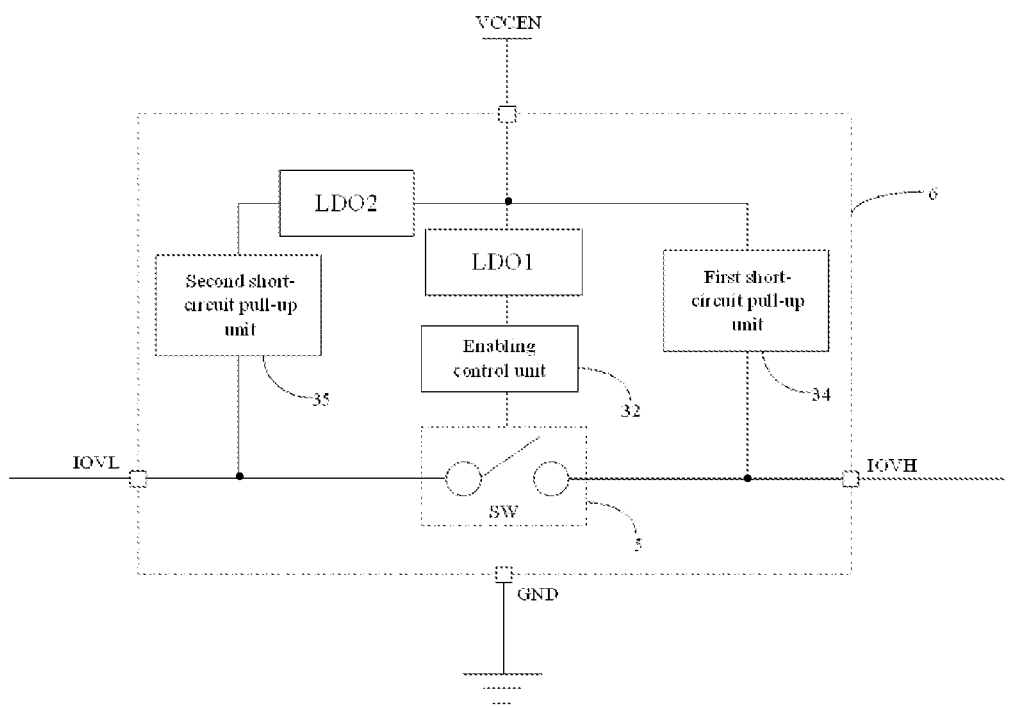
FIG. 5 is a schematic diagram V of a circuit structure of a level conversion circuit according to an embodiment of the present invention.

The selection of the above values can also be applied to the circuits shown in FIG. 3 to FIG. 5.

In the circuits shown in FIG. 3 to FIG. 5, the core module 3 further includes a second voltage regulating unit 33, a first side of the second voltage regulating unit 33 is connected to the target pin 4, and a second side of the second voltage regulating unit 33 is connected to the second pin 2 directly or indirectly. Specifically, the second voltage regulating unit 33 can be, for example, connected to the second pin 2 directly as shown in FIG. 3, or connected to the second pin 2 through a second short-circuit pull-up unit mentioned below.

When the voltage connected to the target pin is at the first reference high level, a voltage at the first side of the second voltage regulating unit is at the first reference high level, and a voltage at the second side of the second voltage regulating unit is at the second reference high level.

The second voltage regulating unit 33 may be capable of regulating voltages, which can be achieved by linear voltage regulation, or achieved by switching a power supply or combining with a voltage divider resistor. In a specific solution, the second voltage regulating unit 33 may be a low dropout regulator (LDO). A voltage at the first side, a voltage at the second side, and the dropout between the voltage at the first side and the voltage at the second side can be preset as required.

Specifically, in the circuits shown in FIG. 3 to FIG. 5, for example, when the second voltage regulating unit is an LDO, the second reference high level at the first side of the second voltage regulating unit 33 can be described as VH_Ref, the voltage at the second side of the second voltage regulating unit 33 can be described as VLDO2, the second reference high level can be described as VL_Ref, and the threshold voltage can be described as Vth, then:

in an example shown in FIG. 3 to FIG. 5, VLDO=VL_Ref; and in an example shown in FIG. 3 to FIG. 5, VLDO=VL_Ref+Vth; in this case, all transmitted signals in a range from GND to VL_Ref can pass through, thereby accelerating the establishment of higher logic high levels.

In one of the implementations, referring to FIG. 4 and FIG. 5, the core module 3 further includes a first short-circuit pull-up unit 34 disposed between the target pin 4 and the first pin 1, and a second short-circuit pull-up unit 35 disposed between the second side of the second voltage regulating unit 33 and the second pin 2.

The short-circuit pull-up unit can be understood as any circuit unit capable of pulling a pin to a corresponding potential by short-circuiting a corresponding circuit position, for example, the first short-circuit pull-up unit can pull up the first pin to a voltage (e.g., the first reference high level) of the target pin, and the second short-circuit pull-up unit can pull up the second pin to a voltage at an output side of the second voltage regulating unit.

In a further solution, a short-circuit pull-up unit can achieve instantaneous short-circuit, and thus, the short-circuit pull-up unit can also be understood as an instantaneous short-circuit pull-up unit. During pull-up, the pull-up can be achieved based on a pull-up resistor, for example, pull-up can be achieved by a 10 kΩ pull-up resistor.

An instantaneous short-circuit pull-up unit may include an instantaneous short-circuit part (which can be understood as a one-shoot circuit part) and a pull-up part (which can be understood as a pull-up circuit part). The instantaneous short-circuit part can be understood as a circuit part that implements instantaneous short-circuit, the pull-up part can achieve a pull-up circuit part, and these parts can be connected in parallel and then connected to corresponding pins. For example, an instantaneous short-circuit part and a pull-up part in the first short-circuit pull-up unit can be connected in parallel, with both ends connected between the target pin and the first pin respectively; and an instantaneous short-circuit part and a pull-up part in the second short-circuit pull-up unit can be connected in parallel, and then connected between the second side of the second voltage regulating unit 33 and the second pin respectively.

Therefore, instantaneous short-circuit between the target pin and the first pin, and instantaneous short-circuit between the second voltage regulating unit and the second pin can be achieved by the instantaneous short-circuit pull-up units. In a circuit, when transmission at a logic high level is detected on one side, the other side pulls up the level quickly through an instantaneous short-circuit circuit part in an instantaneous short-circuit pull-up unit to support signal transmission at a higher speed, and maintain a logic high level state after instantaneous short-circuit through a pull-up part connected in parallel with the instantaneous short-circuit pull-up unit (unless in a logic low level transmission stage). The pull-up part may be a pull-up resistor circuit that is fixed or can be controlled to turn on and off in the circuit, and if controllable, the pull-up part can be controlled by an enabling control unit or other circuits.

Referring to FIG. 5, the above-mentioned first pin is an IOVH pin, the second pin is an IOVL pin, the target pin is a VCCEN pin, and the ground pin is a GND pin, in which the switch 5 can be a switch SW, and a threshold voltage of the switch SW is characterized as VTH, the first voltage regulating unit is LDO1, and the second voltage regulating unit is LDO2.

Therefore, when a voltage of the VCCEN pin is a normal working voltage for the first reference high level VH_Ref, power is supplied to a level conversion circuit chip therein, the first reference high level VH_Ref of the VCCEN pin is input to the LDO1, and an output of the LDO1 is a normal working voltage of the second reference high level VL_Ref. In this case, a voltage at the second reference high level VL_Ref generated inside the chip through the LDO1 assumes the duties of an external second reference high level VL_Ref in the prior art;

the VCCEN pin also generates an output voltage through the LDO2, and controls on-off of the switch SW through the enabling control module 32. In this case, an output of the LDO2 can be the second reference high level VL_Ref or VL_Ref+VTH.

If VLDO2 (i.e., the voltage at the second side of the LDO2)=VL_Ref+VTH, signals in a range from GND to the second reference high level VL_Ref transmitted by the level conversion circuit can pass through, thereby accelerating the establishment of higher logic high levels.

Finally, VH_Ref=GND, LDO1=VL_Ref=GND and LDO2=GND when VCCEN=GND, that is, a gate control voltage of the SW is GND, and thus, the whole level conversion circuit is completely turned off.

It is thus learned that in the solution, a function of level conversion is well implemented, and two pins are reduced, so that die area is reduced and it is easier to select a suitable smaller package, thereby reducing the area of a finished chip. In this way, space is saved and costs are reduced for some space-constrained electronic devices such as mobile phones and wireless Bluetooth headsets.

In actual application, considering that signal logic high levels of a receiver and a transmitter in a circuit system with level conversion are fixed, a voltage at the second reference high level VL_Ref can be stabilized in the level conversion circuit by the LDO1 and a control voltage of the SW can be stabilized by the LDO2 in advance. Therefore, voltages that would otherwise be input are now generated internally, so that pins of a chip are simplified.

An embodiment of the present invention further provides an electronic device, including the above-mentioned level conversion circuit.

Finally, it should be noted that the foregoing embodiments are merely intended for describing the technical solutions of the present invention rather than limiting the present invention. Although the present invention is described in detail with reference to the foregoing embodiments, those of ordinary skill in the art should understand that they may still make modifications to the technical solutions described in the foregoing embodiments or make equivalent replacements to some or all technical features thereof, without departing from the scope of the technical solutions of the embodiments of the present invention.

The invention claimed is:

1. A level conversion circuit, comprising a first pin, a second pin, a target pin, a core module and a switch; wherein
   a first terminal of the switch is connected to the first pin, a second terminal of the switch is connected to the second pin, and the core module is connected to the target pin, the second pin and a control terminal of the switch respectively;
   the core module is configured to:
   when a voltage connected to the target pin is at a first reference high level, control the switch to turn on to transmit a signal with a specified voltage amplitude, and pull the first pin to the first reference high level and the second pin to a second reference high level based on the first reference high level; and control the switch to turn off when the voltage connected to the target pin is at a ground level; wherein the first reference high level is higher than the second reference high level; and at the specified voltage amplitude, a voltage of the signal transmitted through the switch is not higher than the first reference high level and the second reference high level;

wherein the core module comprises a first voltage regulating unit and an enabling control unit;

a first side of the first voltage regulating unit is connected to the target pin, a second side of the first voltage regulating unit is connected to a first side of the enabling control unit, a second side of the enabling control unit is connected to the control terminal of the switch, and the target pin is also connected to the first pin and the second pin directly or indirectly;

when the voltage connected to the target pin is at the first reference high level, a voltage at the first side of the first voltage regulating unit is at the first reference high level, and a voltage at the second side of the first voltage regulating unit is not lower than the second reference high level and not higher than the sum of the second reference high level and a threshold voltage of the switch;

the enabling control unit is configured to: when the voltage connected to the target pin is at the first reference high level, control the switch to turn on in response to the voltage at the second side of the first voltage regulating unit to transmit the signal with the specified voltage amplitude; and control the switch to turn off when the voltage connected to the target pin is at the ground level.

2. The level conversion circuit according to claim 1, wherein the first voltage regulating unit is a low dropout regulator.

3. The level conversion circuit according to claim 2, wherein the level conversion circuit is arranged on a single chip.

4. The level conversion circuit according to claim 1, wherein the core module further comprises a second voltage regulating unit, a first side of the second voltage regulating unit is connected to the target pin, and a second side of the second voltage regulating unit is connected to the second pin directly or indirectly;

when the voltage connected to the target pin is at the first reference high level, a voltage at the first side of the second voltage regulating unit is at the first reference high level, and a voltage at the second side of the second voltage regulating unit is at the second reference high level.

5. The level conversion circuit according to claim 4, wherein the core module further comprises a first short-circuit pull-up unit disposed between the target pin and the first pin, and a second short-circuit pull-up unit disposed between the second side of the second voltage regulating unit and the second pin.

6. The level conversion circuit according to claim 5, wherein the level conversion circuit is arranged on a single chip.

7. The level conversion circuit according to claim 4, wherein the second voltage regulating unit is a low dropout regulator.

8. The level conversion circuit according to claim 7, wherein the level conversion circuit is arranged on a single chip.

9. The level conversion circuit according to claim 4, wherein the level conversion circuit is arranged on a single chip.

10. The level conversion circuit according to claim 1, wherein the level conversion circuit is arranged on a single chip.

11. An electronic device, comprising a level conversion circuit that comprises a first pin, a second pin, a target pin, a core module and a switch; wherein a first terminal of the switch is connected to the first pin, a second terminal of the switch is connected to the second pin, and the core module is connected to the target pin, the second pin and a control terminal of the switch respectively;

the core module is configured to:

when a voltage connected to the target pin is at a first reference high level, control the switch to turn on to transmit a signal with a specified voltage amplitude, and pull the first pin to the first reference high level and the second pin to a second reference high level based on the first reference high level; and control the switch to turn off when the voltage connected to the target pin is at a ground level; wherein the first reference high level is higher than the second reference high level; and at the specified voltage amplitude, a voltage of the signal transmitted through the switch is not higher than the first reference high level and the second reference high level;

wherein the core module comprises a first voltage regulating unit and an enabling control unit;

a first side of the first voltage regulating unit is connected to the target pin, a second side of the first voltage regulating unit is connected to a first side of the enabling control unit, a second side of the enabling control unit is connected to the control terminal of the switch, and the target pin is also connected to the first pin and the second pin directly or indirectly;

when the voltage connected to the target pin is at the first reference high level, a voltage at the first side of the first voltage regulating unit is at the first reference high level, and a voltage at the second side of the first voltage regulating unit is not lower than the second reference high level and not higher than the sum of the second reference high level and a threshold voltage of the switch;

the enabling control unit is configured to: when the voltage connected to the target pin is at the first reference high level, control the switch to turn on in response to the voltage at the second side of the first voltage regulating unit to transmit the signal with the specified voltage amplitude; and control the switch to turn off when the voltage connected to the target pin is at the ground level.

12. The electronic device according to claim 11, wherein the first voltage regulating unit is a low dropout regulator.

13. The electronic device according to claim 11, wherein the core module further comprises a second voltage regulating unit, a first side of the second voltage regulating unit is connected to the target pin, and a second side of the second voltage regulating unit is connected to the second pin directly or indirectly;

when the voltage connected to the target pin is at the first reference high level, a voltage at the first side of the second voltage regulating unit is at the first reference high level, and a voltage at the second side of the second voltage regulating unit is at the second reference high level.

* * * * *